United States Patent
Campbell et al.

(10) Patent No.: US 6,221,939 B1
(45) Date of Patent: Apr. 24, 2001

(54) FLAME RETARDANT RESIN COMPOSITIONS CONTAINING PHOSPHORAMIDES, AND METHOD FOR MAKING

(75) Inventors: John Robert Campbell, Clifton Park, NY (US); John Jeffrey Talley, St. Louis, MO (US); Neal Steven Falcone, Uncasville, CT (US); Johannes Martinus Dina Goossens, Bergen op Zoom (NL); Luc Carlos Govaerts, Hoogstraten (BE); Hendrik Verhoogt; Richard Lucas, both of Bergen op Zoom (NL); James Ross Fishburn, Menands, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/364,915

(22) Filed: Jul. 8, 1999

Related U.S. Application Data

(63) Continuation-in-part of application No. 09/235,679, filed on Jan. 22, 1999, now abandoned, which is a continuation-in-part of application No. 09/144,687, filed on Aug. 31, 1998, now Pat. No. 5,973,041.

(51) Int. Cl.⁷ .................................................. C08K 5/49
(52) U.S. Cl. ........................... 524/117; 525/267; 528/196
(58) Field of Search ............................ 524/117; 525/267; 528/196

(56) References Cited

U.S. PATENT DOCUMENTS

| | | | |
|---|---|---|---|
| 3,868,376 | 2/1975 | Hotten | 252/499 |
| 3,937,765 | 2/1976 | Toy et al. | 428/921 |

FOREIGN PATENT DOCUMENTS

| | | |
|---|---|---|
| 2505326 | 8/1975 | (DE) . |
| 171730 | 2/1986 | (EP) . |
| 1517652 | 7/1978 | (GB) . |
| 55135158 | 10/1980 | (JP) . |
| 7-70158 | 3/1995 | (JP) . |
| 10175985 | 6/1998 | (JP) . |
| WO 93/22373 | 11/1993 | (WO) . |

OTHER PUBLICATIONS

J.J. Talley, "Preparation of Sterically Hindered Phosphoramidates", Journal of Chemical Engineering Data, vol. 33, 221–222 (1988).

*Primary Examiner*—Terressa M. Boykin
(74) *Attorney, Agent, or Firm*—S. Bruce Brown; Noreen C. Johnson

(57) ABSTRACT

The present invention provides resin compositions comprising a thermoplastic resin and at least one phosphoramide having a glass transition point of at least about 0° C., preferably of at least about 10° C., and most preferably of at least about 20° C., of the formula:

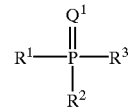

(I)

wherein $Q^1$ is oxygen or sulfur; $R^1$ is an amine residue, and $R^2$ and $R^3$ are each independently an alkyloxy, alkylthio, aryloxy, or arylthio residue, or an aryloxy or arylthio residue containing at least one alkyl substitution; or an amine residue. The present invention also relates to articles made from the resin compositions. The present invention also provides methods to make the resin compositions having improved heat properties over compositions known in the art.

53 Claims, No Drawings

FLAME RETARDANT RESIN COMPOSITIONS CONTAINING PHOSPHORAMIDES, AND METHOD FOR MAKING

This application is a continuation-in-part of application Ser. No. 09/235,679, filed Jan. 22, 1999, abandoned which is a continuation-in-part of application Ser. No. 09/144,687, filed Aug. 31, 1998 now U.S. Pat. No. 5,973,041.

BACKGROUND OF THE INVENTION

The present invention relates to resin compositions comprising a phosphoramide compound having a glass transition temperature of at least about 0° C., preferably of at least about 10° C., and most preferably of at least about 20° C. The invention also relates to methods to make the resin compositions and articles made from the resin compositions.

Compounds containing phosphorus have been used in resin compositions for a variety of reasons. For example, various phosphites have been utilized to enhance the melt stability and/or color stability of resin compositions. Alternatively, various organic phosphate esters have been utilized in resin compositions to improve the flame resistance properties of the compositions and/or to enhance the melt flow characteristics of the compositions. Certain water soluble phosphoramides have also been used in the textile industry as flame retardant finishes for fabrics.

As part consolidation and weight reduction continues to evolve in many industries, the physical property demands placed upon resin manufacturers are increasing. Key industries increasing the demands include the electronics and computer industries, especially for computer housings, computer monitor housings, and printer housings. One increasing demand is for materials that possess higher heat resistance while preferably substantially retaining other key physical properties. Another increasing demand is for materials that are rated in the Underwriter's Laboratory UL-94 test protocol as V-0, or V-1, or V-2. It is therefore apparent that new resin compositions that meet these and other demands continue to be sought.

SUMMARY OF THE INVENTION

The present invention provides resin compositions comprising the following and any reaction products thereof:
a) a thermoplastic resin and
b) at least one phosphoramide having a glass transition point of at least about 0° C., preferably of at least about 10° C., and most preferably of at least about 20° C., of the formula:

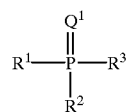

(I)

wherein $Q^1$ is oxygen or sulfur; $R^1$ is an amine residue, and $R^2$ and $R^3$ are each independently an alkyloxy, alkylthio, aryloxy, or arylthio residue, or an aryloxy or arylthio residue containing at least one alkyl substitution; or an amine residue. The present invention also provides articles made from the resin compositions. Furthermore, the present invention provides methods to make resin compositions having improved heat and/or processability over compositions known in the art.

DETAILED DESCRIPTION OF THE INVENTION

The major constituent of the compositions of the invention is at least one thermoplastic polymer. Both addition and condensation polymers are included. Illustrative, non-limiting examples of thermoplastic polymers are olefin polymers such as polyethylene and polypropylene; diene polymers such as polybutadiene and polyisoprene; polymers of ethylenically unsaturated carboxylic acids and their functional derivatives, including acrylic polymers such as poly(alkyl acrylates), poly(alkyl methacrylates), polyacrylamides, polyacrylonitrile and polyacrylic acid; alkenylaromatic polymers such as polystyrene, poly-alpha-methylstyrene, polyvinyltoluene, rubber-modified polystyrenes, and the like; polyamides such as nylon-6 and nylon-66; polyesters; polycarbonates; and polyarylene ethers.

Both thermoplastic and thermoplastic elastomeric polyesters are suitable for use in the present invention. Illustrative, non-limiting examples of thermoplastic polyesters include poly(ethylene terephthalate), poly(1,4-butylene terephthalate), poly(1,3-propylene terephthalate), polycyclohexanedimethanol terephthalate, polycyclohexanedimethanol-co-ethylene terephthalate, polyethylene naphthalate, polybutylene naphthalate, and polyarylates. Illustrative, non-limiting examples of thermoplastic elastomeric polyesters (commonly known as TPE) include polyetheresters such as poly(alkylene terephthalate)s (particularly poly[ethylene terephthalate] and poly[butylene terephthalate]) containing soft-block segments of poly(alkylene oxide), particularly segments of poly(ethylene oxide) and poly(butylene oxide); and polyesteramides such as those synthesized by the condensation of an aromatic diisocyanate with dicarboxylic acids and a carboxylic acid-terminated polyester or polyether prepolymer.

Suitable polyarylates include, but are not limited to, the polyphthalate esters of 2,2-bis(4-hydroxyphenyl)propane (commonly known as bisphenol A), and polyesters consisting of structural units of the formula II:

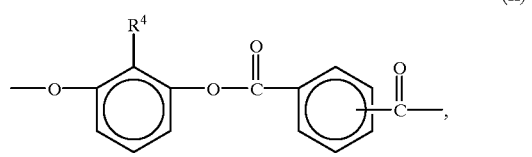

(II)

wherein $R^4$ is hydrogen or $C_{1-4}$ alkyl, optionally in combination with structural units of the formula III:

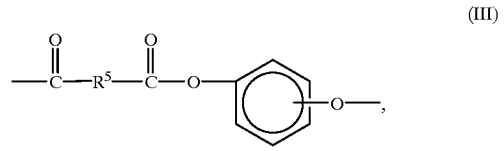

(III)

wherein $R^5$ is a divalent $C_{4-12}$ aliphatic, alicyclic or mixed aliphatic-alicyclic radical. The latter polyesters are prepared by the reaction of a 1,3-dihydroxybenzene with at least one aromatic dicarboxylic acid chloride under alkaline conditions. Structural units of formula II contain a 1,3-dihydroxybenzene moiety which may be substituted with halogen, usually chlorine or bromine, or preferably with $C_{1-4}$ alkyl;

e.g., methyl, ethyl, isopropyl, propyl, butyl. Said alkyl groups are preferably primary or secondary groups, with methyl being more preferred, and are most often located in the ortho position to both oxygen atoms although other positions are also contemplated. The most preferred moieties are resorcinol moieties, in which $R^4$ is hydrogen. Said 1,3-dihydroxybenzene moieties are linked to aromatic dicarboxylic acid moieties which may be monocyclic moieties, e.g., isophthalate or terephthalate, or polycyclic moieties, e.g., naphthalenedicarboxylate. Preferably, the aromatic dicarboxylic acid moieties are isophthalate and/or terephthalate: either or both of said moieties may be present. For the most part, both are present in a molar ratio of isophthalate to terephthalate in the range of about 0.25–4.0:1, preferably about 0.8–2.5:1.

In the optional soft block units of formula II, resorcinol or alkylresorcinol moieties are again present in ester-forming combination with $R^5$ which is a divalent $C_{4-12}$ aliphatic, alicyclic or mixed aliphatic-alicyclic radical. It is preferably aliphatic and especially $C_{8-12}$ straight chain aliphatic. A particularly preferred arylate polymer containing soft block units is one consisting of resorcinol isophthalate and resorcinol sebacate units in a molar ratio between 8.5:1.5 and 9.5:0.5.

Polycarbonates useful in the compositions of the invention include those comprising structural units of the formula IV:

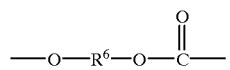
(IV)

wherein at least about 60 percent of the total number of $R^6$ groups are aromatic organic radicals and the balance thereof are aliphatic, alicyclic, or aromatic radicals. Suitable $R^6$ radicals include m-phenylene, p-phenylene, 4,4'-biphenylene, 4,4'-bi(3,5-dimethyl)-phenylene, 2,2-bis(4-phenylene)propane, 6,6'-(3,3,3', 3'-tetramethyl-1,1'-spirobi[1H-indan]), 1,1'-bis(4-phenylene)-3,3,5-trimethylcyclohexane, and similar radicals such as those which correspond to the dihydroxy-substituted aromatic hydrocarbons disclosed by name or formula (generic or specific) in U.S. Pat. No. 4,217,438, which is incorporated herein by reference.

More preferably, $R^6$ is an aromatic organic radical and still more preferably a radical of the formula V:

(V)

wherein each $A^1$ and $A^2$ is a monocyclic divalent aryl radical and $Y^1$ is a bridging radical in which one or two atoms separate $A^1$ and $A^2$. For example, $A^1$ and $A^2$ typically represent unsubstituted phenylene or substituted derivatives thereof. The bridging radical $Y^1$ is most often a hydrocarbon group and particularly a saturated group such as methylene; cyclohexylidene, 3,3,5-trimethylcyclohexylidene; or isopropylidene. The most preferred polycarbonates are bisphenol A polycarbonates, in which each of $A^1$ and $A^2$ is p-phenylene and $Y^1$ is isopropylidene. Preferably, the weight average molecular weight of the initial polycarbonate ranges from about 5,000 to about 100,000; more preferably from about 10,000 to about 65,000, still more preferably from about 16,000 to about 40,000, and most preferably from about 20,000 to about 36,000. Suitable polycarbonates may be made using any process known in the art, including interfacial, solution, solid state, or melt processes.

In one embodiment the present invention comprises a composition containing at least one polycarbonate. In another embodiment the invention comprises compositions containing two different polycarbonates. Both homopolycarbonates derived from a single dihydroxy compound monomer and copolycarbonates derived from more than one dihydroxy compound monomer are encompassed. In a preferred embodiment compositions comprise a bisphenol A homopolycarbonate and a copolycarbonate comprising bisphenol A monomer units and 4,4'-(3,3,5-trimethylcyclohexylidene)diphenol monomer units. Preferably, the copolycarbonate comprises 5–65 mole %, more preferably 15–60 mole %, and most preferably 30–55 mole % of 4,4'(3,3,5-trimethylcyclohexylidene)diphenol with the remaining dihydroxy monomer being bisphenol A. The weight ratio of bisphenol A polycarbonate to copolycarbonate comprising bisphenol A monomer units and 4,4'-(3,3,5-trimethylcyclohexylidene)diphenol monomer units in compositions of the present invention is preferably between 95:5 and 70:30 and more preferably between 85:15 and 75:25.

The polyarylene ethers are most often polyphenylene ethers having structural units of the formula:

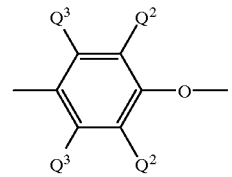

wherein each $Q^2$ is independently halogen, primary or secondary lower alkyl, phenyl, haloalkyl, aminoalkyl, hydrocarbonoxy, or halohydrocarbonoxy wherein at least two carbon atoms separate the halogen and oxygen atoms, and each $Q^3$ is independently hydrogen, halogen, primary or secondary lower alkyl, phenyl, haloalkyl, hydrocarbonoxy or halohydrocarbonoxy as defined for $Q^2$.

Both homopolymer and copolymer polyphenylene ethers are included. The preferred homopolymers are those containing 2,6-dimethyl-1,4-phenylene ether units. Suitable copolymers include random copolymers containing such units in combination with, for example, 2,3,6-trimethyl-1,4-phenylene ether units. Also included are polyphenylene ethers containing moieties prepared by grafting onto the polyphenylene ether in known manner such materials as vinyl monomers or polymers such as polystyrenes and elastomers, as well as coupled polyphenylene ethers in which coupling agents such as low molecular weight polycarbonates, quinones, heterocycles and formals undergo reaction in known manner with the hydroxy groups of two polyphenylene ether chains to produce a higher molecular weight polymer.

The polyphenylene ethers generally have an intrinsic viscosity greater than about 0.1, most often in the range of about 0.2–0.6 and especially about 0.35–0.6 deciliters per gram (dl./g.), as measured in chloroform at 25° C.

The polyphenylene ethers are typically prepared by the oxidative coupling of at least one monohydroxyaromatic compound such as 2,6-xylenol or 2,3,6-trimethylphenol. Catalyst systems are generally employed for such coupling;

they typically contain at least one heavy metal compound such as a copper, manganese or cobalt compound, usually in combination with various other materials.

Particularly useful polyphenylene ethers for many purposes are those which comprise molecules having at least one aminoalkyl-containing end group. The aminoalkyl radical is covalently bound to a carbon atom located in an ortho position to a hydroxy group. Products containing such end groups may be obtained by incorporating an appropriate primary or secondary monoamine such as di-n-butylamine or dimethylamine as one of the constituents of the oxidative coupling reaction mixture. Also frequently present are 4-hydroxybiphenyl end groups and/or biphenyl structural units, typically obtained from reaction mixtures in which a by-product diphenoquinone is present, especially in a copper-halide-secondary or tertiary amine system. A substantial proportion of the polymer molecules, typically constituting as much as about 90% by weight of the polymer, may contain at least one of said aminoalkyl-containing and 4-hydroxy-biphenyl end groups. It will be apparent to those skilled in the art from the foregoing that the polyphenylene ethers contemplated for use in the invention include all those presently known, irrespective of variations in structural units or ancillary chemical features.

Both homopolymer and copolymer thermoplastic polymers are included in the compositions of the present invention. Copolymers may include random, block or graft type. Thus, for example, suitable polystyrenes include homopolymers, such as amorphous polystyrene and syndiotactic polystyrene, and copolymers. The latter embraces high impact polystyrene (HIPS), a genus of rubber-modified polystyrenes comprising blends and grafts wherein the rubber is a polybutadiene or a rubbery copolymer of about 70–98% styrene and 2–30% diene monomer. Also included are ABS copolymers, which are typically grafts of styrene and acrylonitrile on a previously formed diene polymer backbone (e.g., polybutadiene or polyisoprene). Suitable ABS copolymers may be produced by any methods known in the art. Especially preferred ABS copolymers are typically produced by mass polymerization (often referred to as bulk ABS) or emulsion polymerization (often referred to as high rubber graft ABS).

The preferred thermoplastic polymers for many purposes are polyesters, polycarbonates, polyphenylene ethers, polystyrene resin, high impact polystyrene resin (HIPS), and styrene-acrylonitrile copolymers (SAN), including ABS copolymers. These may be employed individually or as blends. Especially preferred blends include those of polyphenylene ether with at least one of HIPS, amorphous polystyrene, and syndiotactic polystyrene; and polycarbonate blends with at least one of ABS, SAN, and polyester.

In resinous compositions there is often an improvement in melt flow and/or other physical properties when one molecular weight grade of at least one resinous constituent is combined with a relatively lower molecular weight grade of similar resinous constituent. Illustrative, non-limiting examples include compositions containing polycarbonate, polyphenylene ether, thermoplastic polyester, thermoplastic elastomeric polyester, or polyamide. For example, in a polycarbonate-containing blend there is often an improvement in melt flow when one molecular weight grade of polycarbonate is combined with a proportion of a relatively lower molecular weight grade of similar polycarbonate. Therefore, the present invention encompasses compositions comprising only one molecular weight grade of a particular resinous constituent and also compositions comprising two or more molecular weight grades of similar resinous constituent. When two or more molecular weight grades of similar resinous constituent are present, then the weight average molecular weight of the lowest molecular weight constituent is about 10% to about 95%, preferably about 40% to about 85%, and more preferably about 60% to about 80% of the weight average molecular weight of the highest molecular weight constituent. In one representative, non-limiting embodiment polycarbonate-containing blends include those comprising a polycarbonate with weight average molecular weight between about 28,000 and about 32,000 combined with a polycarbonate with weight average molecular weight between about 16,000 and about 26,000. When two or more molecular weight grades of similar resinous constituent are present, the weight ratios of the various molecular weight grades may range from about 1 to about 99 parts of one molecular weight grade and from about 99 to about 1 parts of any other molecular weight grades. A mixture of two molecular weight grades of a resinous constituent is often preferred, in which case the weight ratios of the two grades may range from about 99:1 to about 1:99, preferably from about 80:20 to about 20:80, and more preferably from about 70:30 to about 50:50. Since not all manufacturing processes for making a particular resinous constituent are capable of making all molecular weight grades of that constituent, the present invention encompasses compositions comprising two or more molecular weight grades of similar resinous constituent in which each of the similar resins is made by a different manufacturing process. In one particular embodiment the instant invention encompasses compositions comprising a polycarbonate made by an interfacial process in combination with a polycarbonate of different weight average molecular weight made by a melt process.

Another constituent of the resin compositions of the invention is at least one phosphoramide having a glass transition point of at least about 0° C., preferably of at least about 10° C., and most preferably of at least about 20° C., of the formula I:

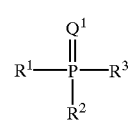

(I)

wherein $Q^1$ is oxygen or sulfur; $R^1$ is an amine residue, and $R^2$ and $R^3$ are each independently an alkyloxy, alkylthio, aryloxy, or arylthio residue, or an aryloxy or arylthio residue containing at least one alkyl or halogen substitution, or mixture thereof; or an amine residue.

It should be noted that in the descriptions herein, the words "radical" and "residue" are used interchangeably, and are both intended to designate an organic moiety. For example, alkyl radical and alkyl residue are both intended to designate an alkyl moiety. The term "alkyl" as used in the various embodiments of the present invention is intended to designate both normal alkyl, branched alkyl, aralkyl, and cycloalkyl radicals. Normal and branched alkyl radicals are preferably those containing from 1 to about 12 carbon atoms, and include as illustrative non-limiting examples methyl, ethyl, propyl, isopropyl, butyl, tertiary-butyl, pentyl, neopentyl, and hexyl. Cycloalkyl radicals represented are preferably those containing from 3 to about 12 ring carbon atoms. Some illustrative non-limiting examples of these cycloalkyl radicals include cyclobutyl, cyclopentyl, cyclohexyl, methylcyclohexyl, and cycloheptyl. Preferred aralkyl radicals are those containing from 7 to about 14 carbon atoms; these include, but are not limited to, benzyl, phenylbutyl, phenylpropyl, and phenylethyl. Aryl radicals used in the various embodiments of the present invention are preferably those containing from 6 to 12 ring carbon atoms. Some illustrative non-limiting examples of these aryl radicals include phenyl, biphenyl, and naphthyl. The preferred halogen radicals used in the various embodiments of the present invention are chlorine and bromine.

The compositions may contain essentially a single phosphoramide or a mixture of two or more different types of phosphoramides. Compositions containing essentially a single phosphoramide are preferred.

When a phosphoramide having a glass transition point of at least about 0° C. is used as a source of phosphorus in resin compositions, it was unexpectedly found that a higher heat deflection temperature of test specimens made from the resin composition could be obtained as compared to compositions containing an organophosphate known in the art for enhancing the processability and/or flame resistance characteristics of the composition.

Although the invention is not dependent upon mechanism, it is believed that selection of each of $R^1$, $R^2$, and $R^3$ residues that result in restricted rotation of the bonds connected to the phosphorus provide an increased glass transition point in comparison to similar phosphoramides with residues having a lesser degree of restriction. Residues having bulky substituents such as, for example, aryloxy residues containing at least one halogen, or preferably at least one alkyl substitution, result in phosphoramides having a higher glass transition point than similar phosphoramides without the substitution on the aryloxy residue. Likewise, residues wherein at least two of the $R^1$, $R^2$, and $R^3$ residues are interconnected, such as a neopentyl residue for the combination of the $R^2$ and $R^3$ residues, can lead to desired phosphoramides having a glass transition point of at least about 0° C.

In a preferred embodiment, the phosphoramide comprises a phosphoramide having a glass transition temperature of at least about 0° C., preferably of at least about 10° C., and most preferably of at least about 20° C., of the formula VI:

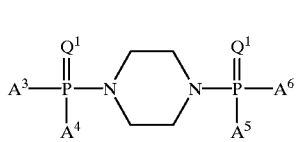

(VI)

wherein each $Q^1$ is independently oxygen or sulfur; and each of $A^{3-6}$ is independently an alkyloxy, alkylthio, aryloxy, or arylthio residue, or an aryloxy or arylthio residue containing at least one alkyl or halogen substitution, or mixture thereof; or an amine residue. In an especially preferred embodiment of the invention, each $Q^1$ is oxygen, and each $A^{3-6}$ moiety is a 2,6-dimethylphenoxy moiety or a 2,4,6-trimethylphenoxy moiety. These phosphoramides are piperazine-type phosphoramides. In the above formula wherein each $Q^1$ is oxygen, and each $A^{3-6}$ moiety is a 2,6-dimethylphenoxy moiety, the glass transition temperature of the phosphoramide is about 62° C. and the melting point is about 192° C. Conversely, in the above formula wherein each $Q^1$ is oxygen, and each $A^{3-6}$ moiety is phenoxy, the glass transition temperature of the phosphoramide is about 0° C. and the melting point is about 188° C. It was unexpected that the glass transition temperature would be so high (i.e. about 62° C.) for the phosphoramide of formula VI where each $Q^1$ is oxygen, and wherein eacg $A^{3-6}$ is a 2,6-dimethylphenoxy moiety as compared to the corresponding phosphoramide of formula VI wherein each $Q^1$ is oxygen, and each of $A^{3-6}$ is a phenoxy moiety (i.e. about 0° C.), especially since the melting points for the phosphoramides differ by only about 4° C. For comparison, the glass transition temperature of tetraphenyl resorcinol diphosphate is about −38° C. It is also possible to make phosphoramides with intermediate glass transition temperatures by using a mixture of various substituted and non-substituted aryl moieties within the phosphoramide.

In another preferred embodiment, the phosphoramide comprises a phosphoramide having a glass transition temperature of at least about 0° C., preferably of at least about 10° C., and most preferably of at least about 20° C., of the formula VII:

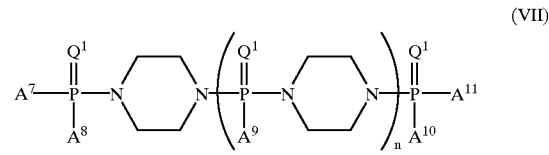

(VII)

wherein each $Q^1$ is independently oxygen or sulfur; and each of $A^{7-11}$ is independently an alkyloxy, alkylthio, aryloxy, or arylthio residue, or an aryloxy or arylthio residue containing at least one alkyl or halogen substitution, or mixture thereof; or an amine residue; and n is from 0 to about 5. In a more preferred embodiment, each $Q^1$ is oxygen, and each $A^{7-11}$ moiety is independently phenoxy, 2,6-dimethylphenoxy, or 2,4,6-trimethylphenoxy, and n is from 0 to about 5.

In another embodiment of the invention the phosphoramide comprises a phosphoramide having a glass transition temperature of at least about 0° C., preferably of at least about 10° C., and most preferably of at least about 20° C., of the formula VIII:

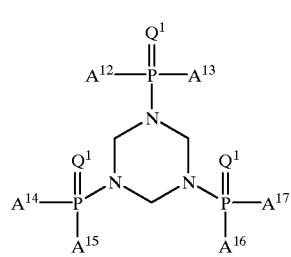

(VIII)

wherein each $Q^1$ is independently oxygen or sulfur; and each of $A^{12-17}$ is independently an alkyloxy, alkylthio, aryloxy, or arylthio residue, or an aryloxy or arylthio residue containing at least one alkyl or halogen substitution, or mixture thereof; or an amine residue. In a more preferred embodiment, each $Q^1$ is oxygen, and each $A^{12-17}$ moiety is independently phenoxy, 2,6-dimethylphenoxy, or 2,4,6-trimethyl-phenoxy.

In another embodiment of the invention the phosphoramide comprises a phosphoramide having a glass transition temperature of at least about 0° C., preferably of at least about 10° C., and most preferably of at least about 20° C., of the formula IX:

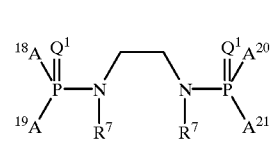

(IX)

wherein each $Q^1$ is independently oxygen or sulfur; each of $A^{18-21}$ is independently an alkyloxy, alkylthio, aryloxy, or arylthio residue, or an aryloxy or arylthio residue containing at least one alkyl or halogen substitution, or mixture thereof; or an amine residue; and each $R^7$ is an alkyl radical, or both $R^7$ radicals taken together are an alkylidene or alkyl-substituted alkylidene radical. In a preferred embodiment, each $Q^1$ is oxygen; both $R^7$ radicals taken together are an unsubstituted $(CH_2)_m$ alkylidene radical, wherein m is 2 to 10; and each $A^{18-21}$ moiety is independently phenoxy, 2,6-dimethylphenoxy, or 2,4,6-trimethyiphenoxy. In a more preferred embodiment, each $Q^1$ is oxygen; each $R^7$ is methyl; and each $A^{18-21}$ moiety is independently phenoxy, 2,6-dimethylphenoxy, or 2,4,6-trimethylphenoxy.

In another embodiment of the invention, the phosphoramide comprises a phosphoramide having a glass transition point of at least about 0° C., preferably of at least about 10° C., and most preferably of at least about 20° C., of the formula I:

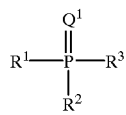

(I)

wherein $Q^1$ is oxygen or sulfur, and $R^1$ is of the formula X:

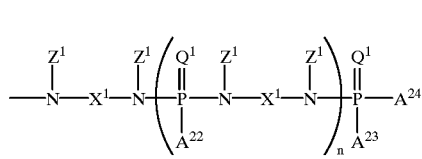

(X)

wherein each $Q^1$ is independently oxygen or sulfur; each of $A^{22-24}$ is independently an alkyloxy, alkylthio, aryloxy, or arylthio residue, or an aryloxy or arylthio residue containing at least one alkyl or halogen substitution, or mixture thereof; or an amine residue; each $Z^1$ is an alkyl radical, aromatic radical, or aromatic radical containing at least one alkyl or halogen substitution or mixture thereof; each $X^1$ is an alkylidene radical, aromatic radical, or aromatic radical containing at least one alkyl or halogen substitution or mixture thereof; n is from 0 to about 5; and $R^2$ and $R^3$ are each independently an alkyloxy, alkylthio, aryloxy, or arylthio residue, or an aryloxy or arylthio residue containing at least one alkyl or halogen substitution, or mixture thereof; or an amine residue. In a preferred embodiment, each $Q^1$ is oxygen; each $A^{22-24}$ moiety is independently phenoxy, 2,6-dimethylphenoxy, or 2,4,6-trimethylphenoxy; each $Z^1$ is methyl or benzyl; each $X^1$ is an alkylidene radical containing 2–24 carbon atoms; n is from 0 to about 5; and $R^2$ and $R^3$ are each independently phenoxy, 2,6-dimethylphenoxy, or 2,4,6-trimethylphenoxy.

In another embodiment of the invention, the phosphoramide comprises a phosphoramide having a glass transition point of at least about 0° C., preferably of at least about 10° C., and most preferably of at least about 20° C., of the formula I:

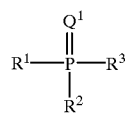

(I)

wherein $Q^1$ is oxygen or sulfur; and $R^1$ is of the formula XI:

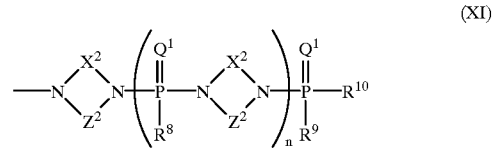

(XI)

wherein each $Q^1$ is independently oxygen or sulfur; each $X^2$ is an alkylidene or alkyl-substituted alkylidene residue, aryl residue, or alkaryl residue; each $Z^2$ is an alkylidene or alkyl-substituted alkylidene residue; each of $R^8$, $R^9$, and $R^{10}$ is independently an alkyloxy, alkylthio, aryloxy, or arylthio residue, or an aryloxy or arylthio residue containing at least one alkyl or halogen substitution, or mixture thereof; or an amine residue; n is from 0 to about 5; and $R^2$ and $R^3$ are each independently an alkyloxy, alkylthio, aryloxy, or arylthio residue, or an aryloxy or arylthio residue containing at least one alkyl or halogen substitution, or mixture thereof; or an amine residue. In a preferred embodiment, each $Q^1$ is oxygen; each $X^2$ is an alkylidene or alkyl-substituted alkylidene residue; each $Z^2$ is an alkylidene or alkyl-substituted alkylidene residue; each of $R^2$, $R^3$, $R^8$, $R^9$, and $R^{10}$ is independently phenoxy, 2,6-dimethylphenoxy, or 2,4,6-trimethylphenoxy; and n is from 0 to about 5. In a more preferred embodiment, each $Q^1$ is oxygen; each $X^2$ and $Z^2$ is independently an unsubstituted alkylidene residue of the form $(CH_2)_m$, wherein m is 2 to 10; each of $R^2$, $R^3$, $R^3$, $R^9$ and $R^{10}$ is independently phenoxy, 2,6-dimethylphenoxy, or 2,4,6-trimethyl-phenoxy; and n is from 0 to about 5. In an especially preferred embodiment, the phosphoramide is derived from piperazine (i.e. $X^2$ and $Z^2$ are each —$CH_2$—$CH_2$—).

In another preferred embodiment, the phosphoramide comprises a cyclic phosphoramide having a glass transition point of at least about 0° C., preferably of at least about 10° C., and most preferably of at least about 20° C., of the formula XII:

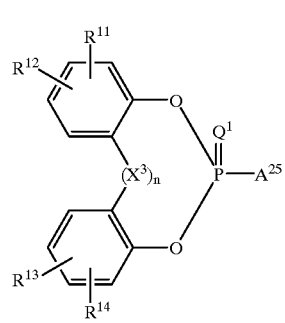

(XII)

wherein each of $R^{11-14}$ is independently a hydrogen or an alkyl radical, $X^3$ is an alkylidene radical, $Q^1$ is oxygen or sulfur, and $A^{25}$ is a group derived from a primary or secondary amine having the same or different radicals that can be aliphatic, alicyclic, aromatic, or alkaryl, or $A^{25}$ is a group derived from a heterocyclic amine, or $A^{25}$ is a hydrazine compound. Preferably $Q^1$ is oxygen. It should be noted that when n is 0, then the two aryl rings are linked together at that site (i.e. where $X^3$ is absent) by a single bond in the positions ortho,ortho' to the phosphoryl bonds.

In another preferred embodiment, the phosphoramide comprises a bis(cyclic) phosphoramide having a glass transition point of at least about 0° C., preferably of at least about 10° C., and most preferably of at least about 20° C. of the formula XIII:

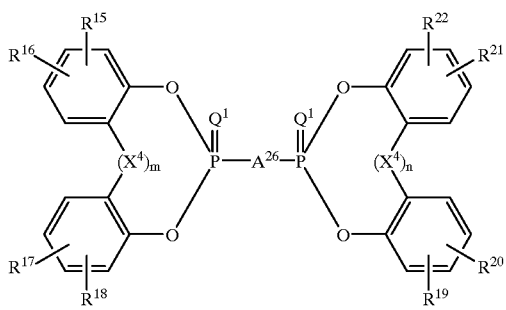

(XIII)

wherein $Q^1$ is oxygen or sulfur; each of $R^{15-22}$ is independently a hydrogen or an alkyl radical; $X^4$ is an alkylidene radical; m and n are each independently 0 or 1; and $A^{26}$ is

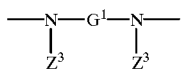

wherein $G^1$ is sulfur, an alkylidene radical, alkyl-substituted alkylidene radical, aryl radical, or alkaryl radical, and each $Z^3$ is independently an alkyl radical, an aryl radical, or an aryl radical containing at least one alkyl or halogen substitution, or mixture thereof; or wherein $A^{26}$ is

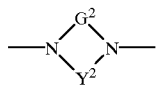

wherein $G^2$ is alkylidene, aryl, or alkaryl, and $Y^2$ is alkylidene or alkyl-substituted alkylidene. Preferred phosphoramides are those wherein $Q^1$ is oxygen, $A^{26}$ is a residue of piperazine, and the phosphoramide has a plane of symmetry through $A^{26}$. Highly preferred phosphoramides include those wherein $Q^1$ is oxygen; $A^{26}$ is a residue of piperazine; the phosphoramide has a plane of symmetry through $A^{26}$; at least one R substituent on each aryl ring is a methyl adjacent to the oxygen substituent; n and m are each 1; and $X^4$ is $CHR^{23}$ wherein $R^{23}$ is a hydrogen or an alkyl residue of from about 1 to about 6 carbon atoms. It should be noted that when either or both of m or n is 0, then the two aryl rings are linked together at that site (i.e. where $X^4$ is absent) by a single bond in the positions ortho,ortho' to the phosphoryl bonds.

Phosphoramides of useful molecular structure are preferably prepared by the reaction of a corresponding amine such as, for example, piperazine or N,N'-dimethylethylenediamine with a diaryl chlorophosphate of the formula $(aryl-O)_2POCl$ in the presence of a tertiary amine. This method of preparation is described in Talley, *J. Chem. Eng. Data*, 33, 221–222 (1988) and leads to specific phosphoramide compounds without repeating units. Alternatively, phosphoramides may be prepared by the reaction of the corresponding amine with $P(O)Cl_3$ in the presence of a tertiary amine, with the desired hydroxyl- or thiohydroxy-containing compound added simultaneously or subsequently to the addition of the amine. Addition of a diamine or triamine to $P(O)Cl_3$ with simultaneous or subsequent addition of the hydroxyl or thiohydroxy-containing compound is believed to lead to repeating units of phosphoramide, often of 1 to about 5 phosphoramide linkages per compound. Similarly, addition of a diamine or triamine to a monosubstituted phosphoryl- or thiophosphoryl dichloride with simultaneous or subsequent addition of hydroxyl- or thiohydroxy-containing compound is also believed to lead to repeating units of phosphoramide. $P(S)Cl_3$ may be substituted for $P(O)Cl_3$ in the above preparations to provide suitable phosphoramides.

The resinous compositions of this invention typically contain a flame retarding and/or processability enhancing amount of at least one phosphoramide, or a mixture of (c) at least one phosphoramide and (d) at least one non-polymeric or polymeric phosphorus additive selected from the group consisting of organic phosphate esters, thiophosphate esters, phosphonate esters, thiophosphonate esters, phosphinate esters, thiophosphinate esters, phosphine oxides, and thiophosphine oxides. For convenience, compounds selected from group (d) are hereinafter referred to as "phosphorus additives". Preferred phosphorus additives are non-polymeric organic phosphate esters including, for example, alkyl phosphate esters, aryl phosphate esters, resorcinol-based phosphate esters, and bisphenol-based phosphate esters known in the art.

The amount of at least one phosphoramide or mixture of at least one phosphoramide and at least one phosphorus additive is typically in the range of about 0.1–5 parts, preferably about 0.25–2.5 parts, of phosphorus per 100 parts of resinous materials (phr), all percentages herein being by weight. The total amount of phosphoramide or of phosphoramide/phosphorus additive mixture is most often in the range of about 1–50 phr, preferably 5–35 phr.

Flame retardancy is preferably measured according to the Underwriters' Laboratory UL-94 protocol. A flame retarding amount is an amount effective to render the composition at least a V-2 rating, preferably at least a V-1 rating, and most preferably a V-0 rating after testing in the UL-94 protocol when measured on a test specimen of about 0.03 to about 0.125 inch in thickness by about 0.5 inch by about 5 inch, preferably about 0.125 inch in thickness by about 0.5 inch by about 5 inch, more preferably about 0.06 inch in thickness by about 0.5 inch by about 5 inch, and most preferably about 0.03 inch in thickness by about 0.5 inch by about 5 inch dimensions. Enhanced processability can be determined, for example, as a reduction in extruder torque during compounding, reduced pressure in injection molding, reduced viscosity, and/or decreased cycle time.

In one embodiment of the present invention halogen-containing flame retardants or other halogen-containing species may also be present in the compositions. In many resinous compositions, the combination of a halogen-containing flame retardant and at least one phosphoramide (or mixture of phosphoramide with at least one phosphorus additive), particularly including a phosphoramide having a glass transition point of at least about 0° C., provides both suitable flame retardant properties and unexpectedly improved high temperature properties (such as measured, for example, by HDT or Tg of a resinous phase). Illustrative, non-limiting examples of halogen-containing flame retardants or halogen-containing species include brominated flame retardants and phosphoramides containing halogenated aromatic substituents. Due to environmental regulations chlorine-free and bromine-free compositions may be preferred for certain applications. Therefore, in a preferred embodiment the present invention includes compositions comprising a thermoplastic resin and at least one phosphoramide having a glass transition point of at least about 0° C., said compositions being essentially free of chlorine and bromine. In this context essentially free means that no chlorine- or bromine-containing species has been added to the compositions in their formulation. In another of its embodiments the present invention includes articles obtained from said chlorine-free or bromine-free compositions.

The compositions of the invention may also contain other conventional additives including stabilizers, inhibitors, plasticizers, fillers, mold release agents, and anti-drip agents. The latter are illustrated by tetrafluoroethylene polymers or copolymers, including mixtures with such other polymers as polystyrene-co-acrylonitrile (sometimes referred to herein as styrene-acrylonitrile copolymer).

A principal characteristic of preferred compositions of the invention is their improved high temperature properties. These are demonstrated by the fact that the decrease in glass transition temperature (Tg) exhibited as a result of the incorporation of a phosphoramide in the composition is substantially less than the corresponding decrease exhibited in blends containing, for example, phosphate esters such as bis(diaryl phosphates) of dihydroxyaromatic compounds. This is evident when a phosphoramide is compared to the organic phosphate ester in amounts suitable to provide enhanced flame resistance when measured, for example, in the UL-94 test procedure. In the case of phase-separated blends such as polycarbonate-ABS blends, the decrease in Tg is noted in the polycarbonate phase.

Experience has shown that the flame retarding properties of a phosphoryl-based compound included in a resinous composition are generally proportional to the amount of phosphorus in the composition rather than to the amount of the compound itself. Thus, equal weights of two additives having different molecular weights but the same flame retarding properties may produce different UL-94 results, but amounts of the two additives which contribute the same proportion of phosphorus to the resinous composition will produce the same UL-94 results. On the other hand, other physical properties such as high temperature resistance are dependent on the amount of the compound itself and relatively independent of the phosphorus proportion therein. For this reason, the dependence of flame retarding and high temperature resistance of compositions containing two phosphorus-based compounds may not follow the same pattern.

It has been shown, however, with respect to the preferred phosphoramides employed according to the present invention that their superior properties of flame retardance and high temperature resistance are consistent. Thus, for example, proportions of the prior art additive resorcinol bis(di-2,6-xylyl phosphate) effective to confer a suitable flame-out time on certain resinous compositions are similar to those produced by a typical bis(2,6-xylyl)-phosphoramide at an essentially equivalent level of phosphorus, but the bisphosphoramide has a substantially lower tendency to decrease heat deflection temperature (HDT) despite the slightly greater amount of the bulk additive.

It should be clear that the present invention also affords methods to increase the heat distortion temperature of flame resistant compositions containing an amount of a phosphorus-containing compound effective to render the composition a flame rating of at least V-2, preferably of at least V-1, most preferably V-0, in the UL-94 protocol, wherein the method comprises combining at least one thermoplastic resin and at least one phosphoramide having a glass transition point of at least about 0° C., preferably of at least about 10° C., and most preferably of at least about 20° C. In a preferred embodiment the invention also affords methods to increase the heat distortion temperature of chlorine-free and bromine-free, flame resistant compositions as described in the previous sentence. The method may be used to increase the heat distortion temperature of compositions containing essentially a single phosphoramide, or a mixture of two or more different types of phosphoramide. Compositions containing essentially a single phosphoramide are often preferred. Useful thermoplastic resins have been described herein. Especially preferred thermoplastic resins are polycarbonate, most especially bisphenol A-based polycarbonate, and blends of polycarbonate, especially polycarbonate-SAN-ABS blends, and polycarbonate-ABS blends, in which the amount of ABS may typically vary from about 1 to about 45 wt. %. An especially preferred phosphoramide is N,N'-bis-[di-(2,6-xylyl)-phosphoryl] piperazine. The method may further comprise at least one phosphorus additive selected from the group consisting of organic phosphate esters, thiophosphate esters, phosphonate esters, thiophosphonate esters, phosphinate esters, thiophosphinate esters, phosphine oxides, and thiophosphine oxides. Preferably, the phosphorus additive is a non-polymeric organic phosphate ester. It should also be clear that the present invention includes compositions made by the methods as well as articles made from the compositions.

Preparation methods for the compositions of the invention are typical of those employed for resinous blends. They may include such steps as dry blending followed by melt processing, the latter operation frequently being performed under continuous conditions as by extrusion. Following melt processing, the compositions are molded into test specimens by conventional means such as injection molding.

The addition of at least one phosphoramide or mixture of at least one phosphoramide and at least one phosphorus additive to the compositions of the present invention may be by mixing all of the blend components together prior to melt processing. Alternatively, any or a combination of any of the phosphorus-containing species, particularly a phosphoramide or a phosphorus additive, may be combined with at least one resinous blend component as a concentrate in a prior processing step. Such concentrates are often made by melt processing. The concentrate may then be combined with the remaining blend components.

The various embodiments of the invention are inclusive of simple blends comprising at least one thermoplastic resin and at least one phosphoramide, and also of compositions in which one or more of said materials has undergone chemical reaction, either by itself or in combination with another blend component. When proportions are specified, they apply to the originally incorporated materials rather than those remaining after any such reaction.

In another of its embodiments the present invention comprises articles of manufacture made from the instantly disclosed compositions. Such articles may be transparent, translucent, or opaque depending upon the blend composition. Said articles can be made by any convenient means known in the art. Typical means include, but are not limited to, injection molding, thermoforming, blow molding, and calendering. Especially preferred articles include indirect and direct wound deflection yokes for all cathode ray tube applications including television and computer monitors, slit type deflection yokes, mold coil deflection yokes, television backplates, docking stations, pedestals, bezels, pallets, electronic equipment such as switches, switch housings, plugs, plug housings, electrical connectors, connecting devices, sockets; housings for electronic equipment such as television cabinets, computer housings, including desk-top computers, portable computers, lap-top computers, palm-held computers; monitor housings, printer housings, keyboards, FAX machine housings, copier housings, telephone housings, mobile phone housings, radio sender and/or receiver housings, lights and lighting fixtures, battery chargers, battery housings, antenna housings, transformers, modems, cartridges, network interface devices, circuit breakers, meter housings, panels for wet and dry appliances such as ishwashers, clothes washers, clothes dryers, refrigerators; heating nd ventilation enclosures, fans, air conditioner housings, cladding and eating for indoor and outdoor application such as public transportation ncluding trains, subways, buses; automotive electrical components.

The invention is illustrated by the following examples. All parts and percentages are by weight. Intrinsic viscosity was determined in chloroform at 25° C. HDT values were determined at 264 psi (1820 kPa) according to ASTM procedure D648.

EXAMPLE 1

Blends of various amounts of a bisphenol A homopolycarbonate, 6.5 parts of a commercially available high rubber graft ABS copolymer and 9 parts of a commercially available SAN copolymer were prepared under identical conditions by blending in a Henschel mixer followed by extrusion on a twin screw extruder and were molded into test specimens. The blends also contained conventional additives including 0.4 part of polytetrafluoroethylene dispersed within styrene-acrylonitrile copolymer as an anti-drip agent, which were not considered in determining proportions, and various amounts of the following phosphoryl-based flame retardant additives: N,N'-bis-[di-(2,6-xylyl)phosphoryl]piperazine (XPP), a compound according to formula VI:

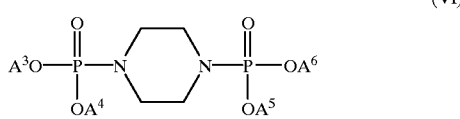

(VI)

wherein each A moiety is a 2,6-dimethylphenyl residue; N,N'-bis(neopentylenedioxy phosphoryl)piperazine (NPP), a compound of similar structure but wherein each pair of A moieties on each phosphorus atom (e.g. the $A^3$ and $A^4$ pair) is a bridging neopentyl residue; N,N'-bis(diphenyl phosphoryl)piperazine (PPP), a compound of similar structure but wherein each A moiety is a phenyl residue; and resorcinol bis(diphenyl phosphate) (RDP) and bisphenol A bis(diphenyl phosphate) (BPADP), two conventional phosphate esters. The FOT (total flameout times for first and second ignitions for 5 bars of 0.125 inch thickness) and Tg of the polycarbonate phase of each test specimen was determined and the results are given in Table I.

TABLE I

| Sample | Base | 1 | 2 | 3 | 4 | 5 |
| --- | --- | --- | --- | --- | --- | --- |
| Polycarbonate, parts | 81.3 | 72.2 | 76.9 | 73.9 | 73.6 | 71.6 |
| FR, identity | none | XPP | NPP | PPP | RDP | BPADP |
| FR, phr | 0 | 12.4 | 6.9 | 10.4 | 10.7 | 13.2 |

TABLE I-continued

| Sample | Base | 1 | 2 | 3 | 4 | 5 |
| --- | --- | --- | --- | --- | --- | --- |
| FR, phr P | 0 | 1.16 | 1.11 | | 0.97 | 1.02 |
| FR, % P | 0 | 1.02 | 1.01 | 1.04 | 1.03 | 1.04 |
| FOT, sec | burns | 19.4 | 84 | — | 20.3 | 27.3 |
| Tg, ° C. | 147 | 131 | 149 | 121 | 111 | 112 |

It is apparent that the compositions of this invention had an significantly reduced FOT and a Tg that differed from that of polycarbonate (147° C.) in a base composition not containing a phosphoramide or phosphate ester by an acceptable increment. Sample 2 had a Tg essentially equal within experimental error to that of the polycarbonate in the base composition but the FOT was appreciably higher than that obtained with XPP. Sample 3 utilizing PPP had a significantly lower Tg that that of XPP and NPP. It was unexpected that XPP-containing compositions (e.g., sample 1) would exhibit such superior FOT as compared to NPP-containing compositions (e.g., sample 2), and such a large increase in polycarbonate Tg as compared to PPP-containing compositions (e.g., sample 3). Samples 4 and 5, employing conventional flame retardants (FR), had unacceptably low Tg's for many commercial applications. The variations in FR content in terms of phr of total FR and of phosphorus are not considered significant from the standpoint of properties.

EXAMPLE 2

In the same base composition used for Example 1, a composition was made containing 4.5 parts RDP and 5.7 XPP. The resultant composition has a flame out time of 17 seconds and the polycarbonate had a Tg of 127° C. The glass transition temperature is higher for this composition that would be expected based upon the results obtained in samples 1 and 4.

EXAMPLE 3

Blends of 62 parts of a commercially available poly(2,6-dimethyl-1,4-phenylene ether) and 38 parts of a commercially available HIPS were prepared and molded under identical conditions similar to those of Example 1. The blends also contained conventional additives including 0.21 part of a polytetrafluoroethylene/styrene-acrylonitrile copolymer as an anti-drip agent, which were not considered in determining proportions, and 20.5 phr of XPP, RDP and BPADP as phosphoryl-based flame retardant additives. The FOT (total flameout times for first and second ignitions for 5 bars of 0.06 inch thickness) and heat deflection temperature (HDT) of each test specimen was determined and the results are given in Table II.

TABLE II

| Sample | 6 | 7 | 8 |
| --- | --- | --- | --- |
| FR, identity | XPP | RDP | BPADP |
| FR, phr P | 1.92 | 1.85 | 1.58 |
| FOT, sec | 24 | 21 | 37 |
| HDT, ° C. | 223.9 | 177.9 | 190.5 |

Again, it is apparent that the composition of the invention (Sample 6) had acceptable FR properties and a significantly higher HDT than the compositions containing conventional FR additives, indicating superior high temperature properties.

EXAMPLE 4

A blend of 40 parts of a commercially available poly(2,6-dimethyl-1,4-phenylene ether) and 60 parts of a commercially available HIPS were prepared and molded under conditions similar to those of Example 3, using N,N'-bis[di-(2,6-xylyl)phosphoryl]piperazine (XPP) as the flame retardant material in essentially the same proportion. The observed FOT was 34 seconds.

EXAMPLE 5

A commercially available HIPS, optionally containing poly(2,6-dimethyl-1,4-phenylene ether) and/or a polystyrene-polybutadiene-polystyrene elastomer, were prepared and molded under conditions similar to those of Example 1, using N,N'-bis[di-(2,6-xylyl)phosphoryl] piperazine (XPP) as the flame retardant material. The compositions and flame out times (FOT, as defined above for Table 1) are provided in Table III.

TABLE III

| Sample | Base | 9 | 10 | 11 | 12 | 13 |
|---|---|---|---|---|---|---|
| HIPS, parts | 100 | 90 | 70 | 65 | 72 | 78.5 |
| PPE, parts | 0 | 0 | 0 | 25 | 7 | 3.5 |
| Rubber, parts | 0 | 0 | 0 | 0 | 2 | 3.5 |
| XPP, parts | 0 | 10 | 30 | 10 | 19 | 14 |
| FOT, sec | burns | 320 | 135 | 400 | 215 | 315 |
| HDT, ° C., 264 psi | 86 | 74 | 68 | 79 | 71 | 73 |

As seen by the above data, phosphoramides as described herein are effective in reducing the flame out time of HIPS, optionally in the presence of PPE and/or rubber. It was unexpected that the flame out times would be so dramatically improved, i.e. decreased, with the addition of the phosphoramide to render the material V-2 under UL-94 classification. It was also unexpected that the HDT would be so high for the compositions containing the phosphoramide.

EXAMPLE 6

Blends of 90 parts of a commercially available bisphenol A polycarbonate were prepared containing 10 parts of either RDP or XPP. The blends also contained conventional additives, including a UV screener and an antioxidant, which were not considered in determining proportions. The compositions were extruded and molded into transparent specimens. Optical properties (according to ASTM 1003-61), including % transmission, yellowness index, and haze, and the Tg of the polycarbonate phase were determined for test specimens of each blend. The results are given in Table IV along with results for a comparable composition containing essentially 100% of the same polycarbonate and no added flame retardant.

TABLE IV

| Sample | Base | 14 | 15 |
|---|---|---|---|
| Polycarbonate | 100 | 90 | 90 |
| RDP | 0 | 10 | 0 |
| XPP | 0 | 0 | 10 |
| Tg, ° C. | 149 | 111 | 131 |
| Transmission, % | 90.1 | 88.3 | 89.5 |
| Haze | 0.7 | 3.3 | 0.7 |
| Yellowness index | 2.24 | 3.18 | 4.16 |

The above data show that the composition containing XPP has the same % transmission and haze as a specimen of essentially pure polycarbonate, and an acceptable yellowness index. Compared to the base sample, the decrease in polycarbonate Tg is only 18° C. for the specimen containing XPP compared to 38° C. for the specimen containing RDP.

EXAMPLE 7

A blend of 26.5 parts of a first bisphenol A homopolycarbonate, 61.8 parts of a second bisphenol A homopolycarbonate with weight average molecular weight about 71% of that of the first bisphenol A homopolycarbonate, 4 parts of a commercially available bulk ABS copolymer, and 5 parts XPP was prepared by blending in a Henschel mixer followed by extrusion on a twin screw extruder and molded into test specimens. The blend also contained 2.75 parts conventional additives including titanium dioxide and polytetrafluoroethylene dispersed within styrene-acrylonitrile copolymer as an anti-drip agent. Measurement of the Melt Volume Rate (260° C. and 5 kilograms applied weight) for the blend gave a value of 24.9 cubic centimeters per 10 minutes. The blend showed a melt viscosity at 280° C. of 390 Pascal-seconds (Pa-s) at a shear rate of 100 sec$^{-1}$, 220 Pa-s at a shear rate of 1500 sec$^{-1}$, and 72 Pa-s at a shear rate of 10000 sec$^{-1}$. The observed FOT (total flameout times for first and second ignitions for 5 bars of 0.06 inch thickness) was 21.5 seconds. A Ball Pressure Test run on test specimens at 125° C. according to test protocol IEC 695-10-2 (1995–08) gave puncture diameter of 1.6 millimeters (mm). Typically, a value of less than 2 mm is desirable for most applications.

EXAMPLE 8

A blend of 64.3 parts bisphenol A homopolycarbonate, 16 parts of a copolycarbonate comprising 45 mole % bisphenol A and 55 mole % 4,4'-(3,3,5-trimethylcyclohexylidene) diphenol (APEC 9371 obtained from Bayer Corp.); 4 parts of a commercially available high rubber graft ABS copolymer; 6 parts of a commercially available SAN copolymer, and 9 parts XPP was prepared by blending in a Henschel mixer followed by extrusion on a twin screw extruder and molded into test specimens. The blend also contained 0.7 parts of conventional additives including polytetrafluoroethylene dispersed within styrene-acrylonitrile copolymer as an anti-drip agent. The blend showed a glass transition temperature of 139° C. The observed FOT (total flameout times for first and second ignitions for 5 bars of 0.06 inch thickness) was 24 seconds.

EXAMPLE 9

The same composition of Example 8 was prepared except that 16 parts of a copolycarbonate comprising 65 mole % bisphenol A and 35 mole % 4,4'-(3,3,5-trimethylcyclo-hexylidene)diphenol (APEC 9351 obtained from Bayer Corp.) was used. The blend showed a glass transition temperature of 140° C. The observed FOT (total flameout times for first and second ignitions for 5 bars of 0.06 inch thickness) was 21 seconds.

What is claimed is:

1. A resin composition comprising the following and any reaction products thereof:
   a) a thermoplastic resin, and
   b) at least one phosphoramide having a glass transition point of at least about 0° C. of the formula:

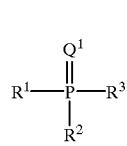

(I)

wherein:
   $Q^1$ is oxygen or sulfur;
   $R^1$ is an amine residue; and
   $R^2$ and $R^3$ are each independently an alkyloxy, alkylthio, aryloxy, or arylthio residue, or an aryloxy or arylthio residue containing at least one alkyl substitution; or an amine residue.

2. The composition of claim 1 wherein at least one phosphoramide has a glass transition point of at least about 10° C.

3. The composition of claim 1 wherein all of the phosphoramide of component b) has a glass transition point of at least about 10° C.

4. The composition of claim 1 wherein at least one phosphoramide has a glass transition point of at least about 20° C.

5. The composition of claim 1 wherein all of the phosphoramide of component b) has a glass transition point of at least about 20° C.

6. The composition of claim 1 wherein the thermoplastic resin is selected from the group consisting of (i) polycarbonate resins and blends containing at least one polycarbonate resin, (ii) polyphenylene ether resins and blends containing at least one polyphenylene ether resin, (iii) polystyrene resin and blends containing polystyrene resin, (iv) styrene-containing copolymer resin and blends containing styrene-containing copolymer resin; (v) styrene-containing graft copolymer resin and blends containing styrene-containing graft copolymer resin; and (vi) high impact polystyrene resin and blends containing high impact polystyrene resin.

7. The composition of claim 1 wherein the thermoplastic resin is selected from the group consisting of high impact polystyrene resin, syndiotactic polystyrene, polyphenylene ether/high impact polystyrene resin blends, polyphenylene ether/syndiotactic polystyrene resin blends, polycarbonate-SAN blends, polycarbonate-ABS blends, polycarbonate-SAN-ABS blends, and polycarbonate-polyester blends.

8. The composition of claim 1 wherein the thermoplastic resin is at least one of polycarbonates, polyphenylene ethers, high impact polystyrenes, syndiotactic polystyrenes, acrylonitrile-butadiene-styrene copolymers, and styrene-acrylonitrile copolymers.

9. The composition of claim 1 wherein the thermoplastic resin comprises at least one polycarbonate and ABS.

10. The composition of claim 9 wherein the at least one polycarbonate comprises bisphenol A polycarbonate and a copolycarbonate of bisphenol A and 4,4'-(3,3,5-trimethylcyclo-hexylidene)diphenol.

11. The composition of claim 9 wherein the at least one phosphoramide comprises a phosphoramide of the formula VI:

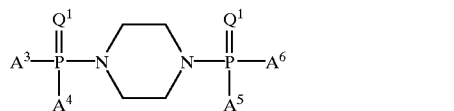

(VI)

wherein each $Q^1$ is independently oxygen or sulfur; and each A moiety is a 2,6-dimethylphenoxy moiety or a 2,4,6-trimethylphenoxy moiety.

12. The composition of claim 9 wherein the at least one phosphoramide comprises a phosphoramide of the formula VI:

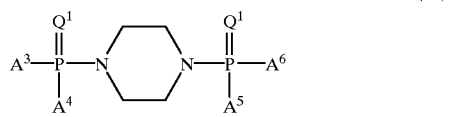

(VI)

wherein each $Q^1$ is oxygen; and each A moiety is a 2,6-dimethylphenoxy moiety.

13. The composition of claim 1 wherein the thermoplastic resin comprises polyphenylene ether and high impact polystyrene resin.

14. The composition of claim 1 further comprising at least one non-polymeric or polymeric phosphorus additive selected from the group consisting of organic phosphate esters, thiophosphate esters, phosphonate esters, thiophosphonate esters, phosphinate esters, thiophosphinate esters, phosphine oxides, and thiophosphine oxides.

15. The composition of claim 14 in which the phosphorus additive is an organic phosphate ester.

16. The composition of claim 15 wherein the combination of phosphoramide and organic phosphate ester is present in an amount effective to render the resin composition a flame rating of V-0, V-1, or V-2 in the Underwriter's Laboratory UL-94 protocol when measured on a test specimen of about 0.125 inch by about 0.5 inch by about 5 inch dimensions.

17. The composition of claim 14 wherein the at least one phosphoramide comprises a phosphoramide of the formula VI:

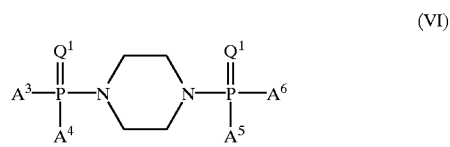

(VI)

wherein each $Q^1$ is independently oxygen or sulfur; and each A moiety is a 2,6-dimethylphenoxy moiety or a 2,4,6-trimethylphenoxy moiety.

18. The composition of claim 14 wherein the at least one phosphoramide comprises a phosphoramide of the formula VI:

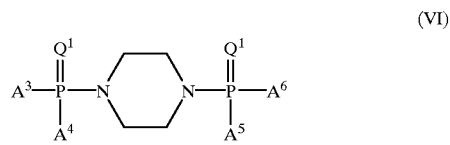

(VI)

wherein each $Q^1$ is oxygen; and each A moiety is a 2,6-dimethylphenoxy moiety.

19. The composition of claim 1 wherein at least one phosphoramide comprises a phosphoramide of the formula VI:

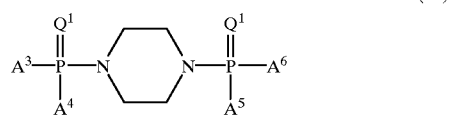

(VI)

wherein each $Q^1$ is independently oxygen or sulfur; and each A moiety is a 2,6-dimethylphenoxy moiety or a 2,4,6-trimethylphenoxy moiety.

20. The composition of claim 1 wherein at least one phosphoramide comprises a phosphoramide of the formula VI:

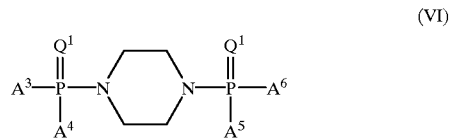

(VI)

wherein each $Q^1$ is oxygen; and each A moiety is a 2,6-dimethylphenoxy moiety.

21. The composition of claim 1 wherein at least one phosphoramide is present in an amount effective to render the resin composition a flame rating of V-0, V-1, or V-2 in the Underwriter's Laboratory UL-94 protocol when measured on a test specimen of about 0.125 inch by about 0.5 inch by about 5 inch dimensions.

22. The composition of claim 1 wherein the total amount of phosphorus per 100 parts of resinous materials is in the range of about 0.1–3 parts by weight.

23. The composition of claim 1 which is essentially free of chlorine and bromine.

24. The composition of claim 1 wherein $R^1$ is of the formula X:

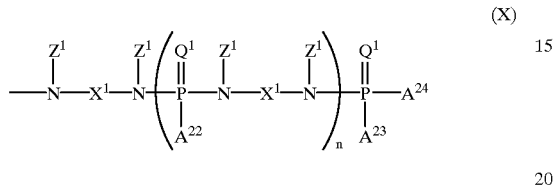

(X)

wherein
each $Q^1$ is independently oxygen or sulfur;
each of $A^{22-24}$ is independently an alkyloxy, alkylthio, aryloxy, or arylthio residue, or an aryloxy or arylthio residue containing at least one alkyl substitution; or an amine residue;
each $Z^1$ is an alkyl radical, aromatic radical, or aromatic radical containing at least one alkyl substitution;
each $X^1$ is an alkylidene radical, aromatic radical, or aromatic radical containing at least one alkyl substitution;
n is from 0 to about 5; and
$R^2$ and $R^3$ are each independently an alkyloxy, alkylthio, aryloxy, or arylthio residue, or an aryloxy or arylthio residue containing at least one alkyl substitution; or an amine residue.

25. The composition of claim 1 wherein $R^1$ is of the formula XI:

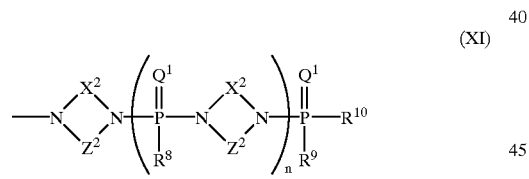

(XI)

wherein
each $Q^1$ is independently oxygen or sulfur;
each $X^2$ is alkylidene, aryl, or alkaryl;
each $Z^2$ is alkylidene;
each of $R^8$, $R^9$, and $R^{10}$ is independently an alkyloxy residue, an aryloxy residue, an aryloxy residue containing at least one alkyl substitution, or an amine residue; and
n is from 0 to about 5; and
$R^2$ and $R^3$ are each independently an alkyloxy, alkylthio, aryloxy, or arylthio residue, or an aryloxy or arylthio residue containing at least one alkyl substitution; or an amine residue.

26. A resin composition comprising the following and any reaction products thereof:

a) a thermoplastic resin b) at least one phosphoramide having a glass transition point of at least about 0° C. of the formula VIII:

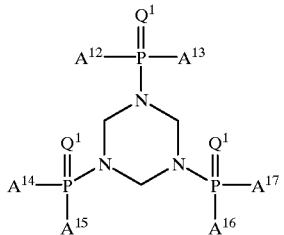

(VIII)

wherein
each $Q^1$ is independently oxygen or sulfur; and
each of $A^{12-17}$ is independently an alkyloxy, alkylthio, aryloxy, or arylthio residue, or an aryloxy or arylthio residue containing at least one alkyl substitution; or an amine residue.

27. A resin composition comprising the following and any reaction products thereof:

a) a thermoplastic resin and b) at least one cyclic phosphoramide having a glass transition point of at least about 0° C. of the formula XII:

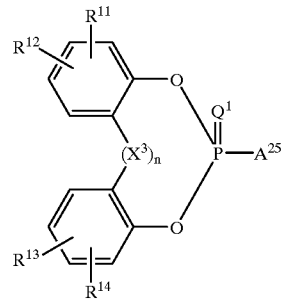

(XII)

wherein $Q^1$ is oxygen or sulfur;
each of $R^{11-14}$ is independently a hydrogen or an alkyl radical;
$X^3$ is a alkylidene radical;
n is 0 or 1; and
$A^{25}$ is a group derived from a primary or secondary amine having the same or different radicals that can be aliphatic, alicyclic, aromatic, or alkaryl, or $A^{25}$ is a group derived from a heterocyclic amine, or $A^{25}$ is a hydrazine compound.

28. A resin composition comprising the following and any reaction products thereof:

a) a thermoplastic resin b) at least one bis(cyclic) phosphoramide having a glass transition point of at least about 0° C. of the formula XIII:

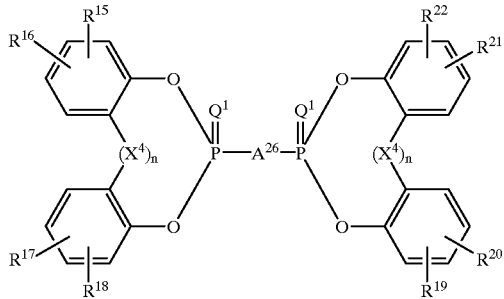
(XIII)

wherein each $Q^1$ independently is oxygen or sulfur;
each of $R^{15-22}$ is independently a hydrogen or an alkyl radical;
$X^4$ is an alkylidene radical; m and n are each independently 0 or 1; and
$A^{26}$ is

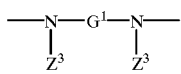

wherein $G^1$ is sulfur, an alkylidene radical, aryl radical, or alkaryl radical; and each $Z^3$ is independently an alkyl radical or an aryl radical; or wherein $A^{26}$ is

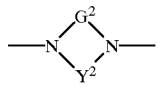

wherein $G^2$ is alkylidene, aryl, or alkaryl, and $Y^2$ is alkylidene.

29. A resin composition consisting essentially of:
a) a thermoplastic resin and
b) at least one phosphoramide having a glass transition point of at least about 0° C. of the formula:

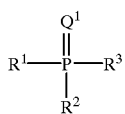
(I)

wherein
$Q^1$ is oxygen or sulfur;
$R^1$ is an amine residue, and
$R^2$ and $R^3$ are each independently an alkyloxy, alkylthio, aryloxy, or arylthio residue, or an aryloxy or arylthio residue containing at least one alkyl substitution; or an amine residue.

30. An article made from the composition of claim 1.

31. The article of claim 30 which is a deflection yoke for cathode ray tube, deflection yoke for television, slit type deflection yoke, mold coil deflection yoke, television backplate, docking station, pedestal, bezel, pallet, switch, switch housing, plug, plug housing, electrical connector, connecting device, socket, television housing, computer housing, desk-top computer housing, portable computer housing, lap-top computer housing, palm-held computer housing; monitor housing, printer housing, keyboard, FAX machine housing, copier housing, telephone housing, mobile phone housing, radio sender housing, radio receiver housing, light fixture, battery charger housing, battery housing, automotive electrical component, antenna housing, transformer housing, modem, cartridge, network interface device housing, circuit breaker housing, meter housing, panel for wet or dry appliance, dishwasher panel, clothes washer panel, clothes dryer panel, refrigerator panel; heating or ventilation enclosure, fan, air conditioner housing, cladding or seating for public transportation; or cladding or seating for trains, subways, or buses.

32. A method to increase the heat distortion temperature of a flame resistant composition containing an amount of a phosphorus-containing compound effective to render the composition a flame rating of at least V-2 in the Underwriter's Laboratory UL-94 protocol when measured on a test specimen of about 0.125 inch by about 0.5 inch by about 5 inch dimensions, wherein the method comprises combining at least one thermoplastic resin and at least one phosphoramide having a glass transition point of at least about 0° C.

33. The method of claim 32 wherein the composition has a flame rating of least V-1.

34. The method of claim 32 wherein the composition has a flame rating of least V-0.

35. The method of claim 32 wherein at least one phosphoramide has a glass transition point of at least about 10° C.

36. The method of claim 32 wherein the phosphoramide has a glass transition point of at least about 10° C.

37. The method of claim 32 wherein at least one phosphoramide has a glass transition point of at least about 20° C.

38. The method of claim 32 wherein the phosphoramide has a glass transition point of at least about 20° C.

39. The method of claim 32 wherein the at least one phosphoramide comprises a phosphoramide of the formula VI:

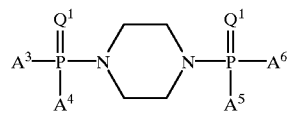
(VI)

wherein each $Q^1$ is independently oxygen or sulfur; and
each A moiety is a 2,6-dimethylphenyl moiety or a 2,4,6-trimethylphenyl moiety.

40. The method of claim 32 wherein the thermoplastic resin is selected from the group consisting of (i) polycarbonate resins and blends containing at least one polycarbonate resin, (ii) polyphenylene ether resins and blends containing at least one polyphenylene ether resin, (iii) polystyrene resin and blends containing polystyrene resin, (iv) styrene-containing copolymer resin and blends containing styrene-containing copolymer resin; (v) styrene-containing graft copolymer resin and blends containing styrene-containing graft copolymer resin; and (vi) high impact polystyrene resin and blends containing high impact polystyrene resin.

41. The method of claim 32 wherein the thermoplastic resin is a polycarbonate resin or a blend containing at least one polycarbonate resin.

42. The method of claim 32 wherein the thermoplastic resin comprises at least one polycarbonate and ABS.

43. The method of claim 42 wherein the at least one polycarbonate comprises bisphenol A polycarbonate and a copolycarbonate of bisphenol A and 4,4'-(3,3,5-trimethylcyclo-hexylidene)diphenol.

44. The method of claim 32 wherein the method further comprises at least one non-polymeric or polymeric phosphorus additive selected from the group consisting of organic phosphate esters, thiophosphate esters, phosphonate esters, thiophosphonate esters, phosphinate esters, thiophosphinate esters, phosphine oxides, and thiophosphine oxides.

45. The method of claim 44 in which the phosphorus additive is an organic phosphate ester.

46. The method of claim 32 in which the composition is essentially free of chlorine and bromine.

47. The flame resistant composition of claim 45.

48. The flame resistant composition of claim 32.

49. A resin composition comprising the following and any reaction products thereof:
   a) a thermoplastic resin is selected from the group consisting of (i) polycarbonate resins and blends containing at least one polycarbonate resin, (ii) polyphenylene ether resins and blends containing at least one polyphenylene ether resin, (iii) polystyrene resin and blends containing polystyrene resin, (iv) styrene-containing copolymer resin and blends containing styrene-containing copolymer resin; (v) styrene-containing graft copolymer resin and blends containing styrene-containing graft copolymer resin; and (vi) high impact polystyrene resin and blends containing high impact polystyrene resin; and
   b) a phosphoramide having a glass transition point of at least about 20° C. of the formula VI:

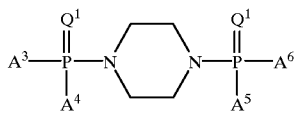

(VI)

wherein each $Q^1$ is oxygen; and each A moiety is a 2,6-dimethylphenoxy moiety.

50. The composition of claim 49 wherein the thermoplastic resin comprises at least one polycarbonate and ABS.

51. An article made from the composition of claim 50.

52. A method to increase the heat distortion temperature of a flame resistant composition containing an amount of a phosphorus-containing compound effective to render the composition a flame rating of at least V-2 in the Underwriter's Laboratory UL-94 protocol when measured on a test specimen of about 0.125 inch by about 0.5 inch by about 5 inch dimensions, wherein the method comprises combining
   a) at least one thermoplastic resin selected from the group consisting of (i) polycarbonate resins and blends containing at least one polycarbonate resin, (ii) polyphenylene ether resins and blends containing at least one polyphenylene ether resin, (iii) polystyrene resin and blends containing polystyrene resin, (iv) styrene-containing copolymer resin and blends containing styrene-containing copolymer resin; (v) styrene-containing graft copolymer resin and blends containing styrene-containing graft copolymer resin; and (vi) high impact polystyrene resin and blends containing high impact polystyrene resin; and
   b) a phosphoramide having a glass transition point of at least about 20° C. of the formula VI:

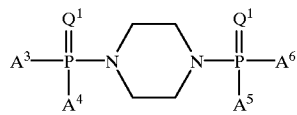

(VI)

wherein each $Q^1$ is oxygen; and each A moiety is a 2,6-dimethylphenoxy moiety.

53. The composition of claim 32 wherein the thermoplastic resin comprises at least one polycarbonate and ABS.

* * * * *